(12) United States Patent
Waffenschmidt (10) Patent No.: US 9,192,000 B2
(45) Date of Patent: Nov. 17, 2015

(54) GAS-TIGHT ELECTROLUMINESCENT DEVICE

(75) Inventor: Eberhard Waffenschmidt, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 269 days.

(21) Appl. No.: 13/814,389

(22) PCT Filed: Jul. 18, 2011

(86) PCT No.: PCT/IB2011/053184
§ 371 (c)(1),
(2), (4) Date: Feb. 5, 2013

(87) PCT Pub. No.: WO2012/020342
PCT Pub. Date: Feb. 16, 2012

(65) Prior Publication Data
US 2013/0134873 A1 May 30, 2013

(30) Foreign Application Priority Data
Aug. 13, 2010 (EP) .................................... 10172797

(51) Int. Cl.
| | |
|---|---|
| *H01K 1/62* | (2006.01) |
| *H05B 33/04* | (2006.01) |
| *F21V 23/02* | (2006.01) |
| *F21V 31/00* | (2006.01) |
| *H01L 51/52* | (2006.01) |
| *H05B 33/08* | (2006.01) |
| *F21Y 105/00* | (2006.01) |

(52) U.S. Cl.
CPC ................ *H05B 33/04* (2013.01); *F21V 23/02* (2013.01); *F21V 31/00* (2013.01); *H01L 51/5203* (2013.01); *H01L 51/524* (2013.01); *H01L 51/5243* (2013.01); *H05B 33/08* (2013.01); *F21Y 2105/006* (2013.01); *H01L 2251/5361* (2013.01)

(58) Field of Classification Search
CPC .............. H01L 51/5012; H01L 51/524; H01L 51/5246
USPC ............... 315/70, 71; 362/158, 645; 313/323, 313/324, 498, 502, 503, 504, 506
See application file for complete search history.

(56) References Cited

U.S. PATENT DOCUMENTS

| | | | |
|---|---|---|---|
| 5,264,997 A | 11/1993 | Hutchisson et al. | |
| 6,506,616 B1 | 1/2003 | Kim et al. | |
| 2006/0087224 A1 | 4/2006 | Oki et al. | |
| 2008/0042558 A1* | 2/2008 | Buchhauser et al. | 313/504 |
| 2008/0231180 A1 | 9/2008 | Waffenschmidt et al. | |
| 2009/0159677 A1 | 6/2009 | Yakimov et al. | |

(Continued)

FOREIGN PATENT DOCUMENTS

| | | |
|---|---|---|
| CN | 201438641 U | 4/2010 |
| FR | 1302259 A | 8/1962 |
| WO | 2011027280 A1 | 3/2011 |

*Primary Examiner* — William Hernandez
(74) *Attorney, Agent, or Firm* — Meenakshy Chakravorty (57) ABSTRACT

The invention relates to a gas-tight electroluminescent device (100) with an electroluminescent part (104) and a sealing part (102). The electroluminescent part comprises an electroluminescent layer (114), a first electrode layer (112), and a second electrode layer (116). The sealing part comprises a substrate (106), a cover plate (110) for gas-tight sealing the electroluminescent device, and at least one receiver winding (105; 206; 208; 406) for receiving electromagnetic radiation.

11 Claims, 5 Drawing Sheets

(56) References Cited

U.S. PATENT DOCUMENTS

2009/0290332 A1 11/2009 Jacobs et al.
2010/0295443 A1* 11/2010 Roberts et al. ................. 313/504
2014/0327356 A1* 11/2014 Nakai et al. ..................... 315/34

* cited by examiner

GAS-TIGHT ELECTROLUMINESCENT DEVICE

FIELD OF THE INVENTION

The invention relates to the field of electroluminescent devices, more specifically to the field of gas-tight electroluminescent devices.

BACKGROUND OF THE INVENTION

Gas-tight electroluminescent devices are advantageous for lighting wet environments such as swimming pools or bathrooms.

US Patent Application US 2009/0159677 A1 discloses a contactless power and data transfer system. The system includes an encapsulated optoelectronic semiconductor device at least partially disposed within a barrier encapsulation, and a contactless power transfer system configured to transfer at least one of power and data across the barrier encapsulation. A method for manufacturing a contactless power and data transfer system is also disclosed.

SUMMARY OF THE INVENTION

It is an object of the present invention to provide an improved gas-tight electroluminescent device, an improved illuminating apparatus, an improved illuminating system, and an improved method of producing a gas-tight electroluminescent device.

This object is achieved by the gas-tight electroluminescent device, the illuminating apparatus, the illuminating system, and the method of producing a gas-tight electroluminescent device according to the independent claims. Embodiments of the invention are given in the dependent claims.

The invention provides a gas-tight electroluminescent device comprising an electroluminescent part and a sealing part. The electroluminescent part comprises an electroluminescent layer, a first electrode layer, and a second electrode layer. The sealing part comprises a substrate, a cover plate for gas-tight sealing the electroluminescent device and at least one receiver winding for receiving electromagnetic radiation. It is to be noted that the receiver winding is comprised by the sealing part. In other words, the receiver winding is part of the sealing of the gas-tight electroluminescent device.

The electroluminescent layer is located between the first and the second electrode layer. The sealing part is connected gas-tight to the electroluminescent part via the cover plate. The first electrode layer is electrically connected to a first point of the receiver winding. The second electrode layer is electrically connected to a second point of the receiver winding. The at least one receiver winding is arranged on the substrate.

According to embodiments of the invention the electrical connection of the first electrode layer to the first point of the receiver winding leads through a feedthrough. The feedthrough leads through the substrate. The electrical connection via the feedthrough is advantageous because it allows integrating the receiver winding into the sealing part. Integrating the receiver winding into the sealing part reduces the thickness of the electroluminescent device.

According to embodiments of the invention the cover plate is a glass plate. Using a glass plate is advantageous for avoiding eddy currents in the cover plate. Eddy currents could be induced by the electromagnetic field intended to be received by the receiver winding. The glass plate is adapted for sealing the electroluminescent device gas-tight without receiving electromagnetic radiation.

According to embodiments of the invention the cover plate is an electrically conductive plate. The electroluminescent device further comprises a soft magnetic shielding for avoiding induction of an electric current into the electrically conductive plate by electromagnetic radiation. Using the electrically conductive plate as cover plate is advantageous, because the electrically conductive plate may be used as a connection between the first or the second electrode layer and the receiver winding. This avoids using cables or other electrical connections. In these embodiments the electrically conductive plate is adapted for gas-tight sealing the electroluminescent device and for connecting the first or the second electrode layer with the receiver winding. Preferably, the electrically conductive plate is a metal plate.

A soft magnetic shielding is required in these embodiments for avoiding induction of an electric current into the electrically conductive plate by electromagnetic radiation. The soft magnetic shielding is located between the substrate and the electrically conductive plate. Thus, electromagnetic radiation may be received by the receiver winding but not by the electrically conductive plate because the electromagnetic radiation is shielded by the soft magnetic shielding. Additionally, the soft magnetic shielding is adapted for avoiding induction of an electric current into at least one of the electrode layers.

The electromagnetic radiation used for inducing a voltage in the at least one receiver winding would generate eddy currents in the metal plate which would cause losses and degrade the performance of the system, if there was no soft-magnetic shielding. The inductivity L of the receiver winding would reduce and the series resistance R would increase. Both affect the quality factor Q of the receiver coil. Q is defined as $$Q = \frac{2\pi f \cdot L}{R},$$

where f is the frequency of the electromagnetic radiation.

Q should be as high as possible and preferably have a value greater than 10.

The soft-magnetic shielding can be inserted between the receiver winding and the metal plate. There are also materials available, which can be integrated in a printed circuit board. Several materials are possible.

The frequency of the electromagnetic radiation may for example be in the range between 100 kHz and 1 MHz.

The relative magnetic permeability $\mu_r$ of the soft-magnetic shielding may for example be $2<\mu_r<30$, preferably $5<\mu_r<20$. The material of the soft-magnetic shielding may for example be iron or a soft-magnetic powder in a polymer matrix, such as a Ferrite Polymer Compound (FPC).

According to embodiments of the invention the at least one receiver winding comprises first and second receiver windings. The first receiver windings are arranged above the substrate. The first receiver windings are separated by gaps. The first and the second receiver windings are electrically connected to each other with a plurality of feedthroughs. The feedthroughs lead through the substrate. In other words, the substrate is located between the first and the second receiver windings. The first and the second receiver windings are adapted for gas-tight sealing the electroluminescent device. The substrate may for example be made from polymer, through which gas like oxygen and moisture may diffuse.

Preferably, the receiver windings are made from metal, through which such gas may not diffuse. The first and the second receiver windings are used for sealing the electroluminescent device, because the second receiver windings are arranged below the substrate under the gaps of the first receiver windings. Thus, the second receiver windings prevent gas from diffusing through the sealing part of the electroluminescent device.

According to embodiments of the invention the first or the second electrode layer is electrically connected to the at least one receiver winding via the cover plate.

According to embodiments of the invention the at least one receiver winding has a winding origin and a peripheral winding end. The first point of the receiver winding is located at the winding origin and the second point of the receiver winding is located at the peripheral winding end. These embodiments of the invention are advantageous, because with only one winding layer an induction of the current into the electroluminescent device is possible. Preferably, the winding origin is located in the middle region of the substrate. By contacting the receiver winding in the winding origin and at the peripheral winding end the voltage difference between these two points is used for inducing a current into the electroluminescent part of the electroluminescent device.

According to embodiments of the invention the winding origin is connected to the metal plate, which is in contact to the first electrode layer. The second electrode layer is connected to the outside by a planar track underneath the metal plate, wherein the connection of the planar track with the second electrode layer is sealed by non-conducting glue. The peripheral winding end is then connected to the second electrode layer. This way, the metal plate is used as electrical connection from the winding origin and no feedthrough is needed.

According to embodiments of the invention the substrate is made of polymers.

According to embodiments of the invention the substrate comprises at least one metal layer for avoiding gas diffusion through the substrate. In other words, the substrate is adapted for sealing the electroluminescent device.

According to embodiments of the invention the electroluminescent device comprises a glass mounting structure. The second electrode layer is located on the glass mounting structure. The second electrode layer is transparent. The glass mounting structure may also be referred to as a glass plate.

In another aspect the invention relates to an illuminating apparatus comprising a plurality of electroluminescent devices according to embodiments of the invention.

In yet another aspect the invention relates to an illuminating system comprising an electroluminescent device according to embodiments of the invention and an inductor. The inductor is adapted for establishing an electromagnetic field in the region of the electroluminescent device. The electromagnetic field induces a current in the electroluminescent device.

In yet another aspect the invention relates to a method of producing a gas-tight electroluminescent device according to embodiments of the invention. An electroluminescent part is provided. The electroluminescent part comprises a first electrode layer, a second electrode layer, and an electroluminescent layer.

A sealing part is provided. The sealing part comprises a substrate, at least one receiver winding and a cover plate. The at least one receiver winding is arranged on the substrate. The cover plate is mechanically connected to the substrate. The electroluminescent part is connected to the sealing part via the cover plate. The electroluminescent and the sealing part form the gas-tight electroluminescent device.

A first electrical connection is established between the first electrode layer and the at least one receiver winding. A second electrical connection is established between the second electrode layer and the at least one receiver winding.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Like numbered elements in these FIGS. are either identical elements or perform the same function. Elements which have been discussed previously will not necessarily be discussed in later FIGS. if the function is identical.

Figure 1:
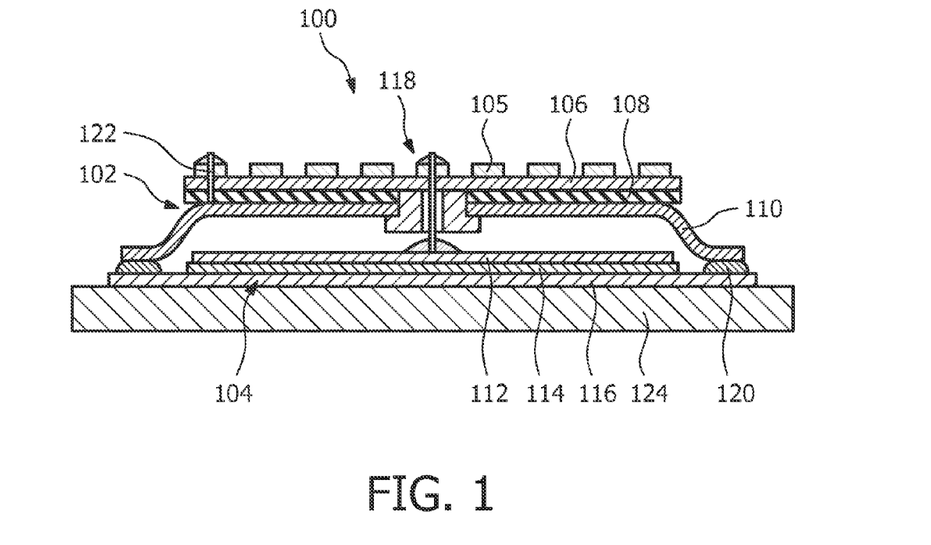
FIG. 1 is a schematic side view of an electroluminescent device comprising a metal cover plate and a soft magnetic shielding.

FIG. 1 is a schematic side view of an electroluminescent device 100 according to embodiments of the invention. The electroluminescent device comprises a sealing part 102 and an electroluminescent part 104. The sealing part 102 comprises a receiver winding 105, a substrate 106, a soft magnetic shielding 108, and a metal plate 110.

The electroluminescent part comprises a first electrode layer 112, an electroluminescent layer 114, and a second electrode layer 116. The electroluminescent layer 114 is adapted for emitting light when a voltage is applied between the first electrode layer 112 and the second electrode layer 116.

The receiver winding 105 is connected to the first electrode layer 112 via a first feedthrough 118. The feedthrough 118 leads through the substrate 106, the soft magnetic shielding 108, and the metal plate 110.

The second electrode layer 116 is connected with conducting glue 120 to the metal plate 110. The metal plate 110 is connected to the receiver winding 105 via a second feedthrough 122.

The first feedthrough 118 connects the first electrode layer 112 to a first point of the receiving winding 105. For example a metal wire may be arranged in the feedthrough 118 with contact to the first electrode layer 112 and the receiver winding 105 for electrically connecting the first electrode layer 112 to the receiver winding 105. The second feedthrough 122 connects the metal plate 110 to a second point of the receiver winding 105. For example a metal wire may be arranged in the feedthrough 122 such that the metal wire is in contact with the metal plate 110 and the receiver winding 105 for electrically connecting the metal plate 110 to the receiver winding 105. The metal plate 110 is connected via conducting glue 120 to the second electrode layer 116. Thus, the second electrode layer 116 is connected via conducting glue 120, metal plate 110, and feedthrough 122 to receiver winding 105.

The second electrode layer 116 is arranged on a glass plate 124. Preferably, the second electrode is made of indium tin oxide (ITO), which is transparent. Thus, when applying a voltage between the first electrode layer 112 and the second electrode layer 116 the electroluminescent layer 114 emits light, which may pass the second electrode layer 116. The light emitted by electroluminescent layer 114 is emitted through the second electrode layer 116 and the glass plate 124. The first electrode layer 112 is preferably made of metal, even more preferably the first electrode layer 112 is made of aluminum.

The sealing part 102 is adapted for receiving electromagnetic radiation via receiver winding 105. The electroluminescent part 104 is adapted for emitting light through the glass plate 124. In other words, electromagnetic radiation may be received by the receiver winding 105 in sealing part 102 and light may be emitted by electroluminescent layer 114 through second electrode layer 116 and glass plate 124.

When electromagnetic radiation is received by receiver winding 105 a voltage is induced into receiver winding 105. Receiver winding 105 is arranged such that the first feedthrough 118 is connected to a first point in the center region of receiver winding 105 and the second feedthrough 122 is connected to a peripheral winding of receiver winding 105. In other words, when following the way of receiver winding 105 the receiver winding 105 starts at the first point, where feedthrough 118 is connected to the receiver winding 105. The receiver winding 105 ends at the second feedthrough 122 in the peripheral region of the receiver winding 105.

Thus, when an electromagnetic radiation is received by receiver winding 105, a voltage is induced into receiver winding 105. Depending on the direction of the electromagnetic radiation a high potential may be induced at the first point of receiver winding 105 or at the second point of receiver winding 105. Independent of the direction of the radiation a potential difference is induced between the first point of receiver winding 105 and the second point of receiver winding 105.

This potential difference is also present between the first electrode layer 112 and the second electrode layer 116. Thus, the electroluminescent layer 114 emits light because of the potential difference between first electrode layer 112 and second electrode layer 116.

By integrating receiver winding 105 into the sealing part 102 the electroluminescent device 100 does not need an additional receiving part. Receiving the electromagnetic radiation is performed in the sealing part 102.

Another advantage of the electroluminescent device 100 is that the metal plate 110 connects the second electrode layer 116 to the feedthrough 122. The metal plate 110 is on the one side adapted for electrically connecting electrode layer 116 to feedthrough 122 and on the other side the metal plate 110 is also adapted for gas-tight sealing the electroluminescent device 100.

Metal plate 110 impedes gas from entering into electroluminescent device 100. Also the connecting glue 120 and the feedthrough 118 are gas-tight. Thus, the electroluminescent part 104 of the electroluminescent device 100 is gas-tight sealed by the sealing part 102.

Figure 2:
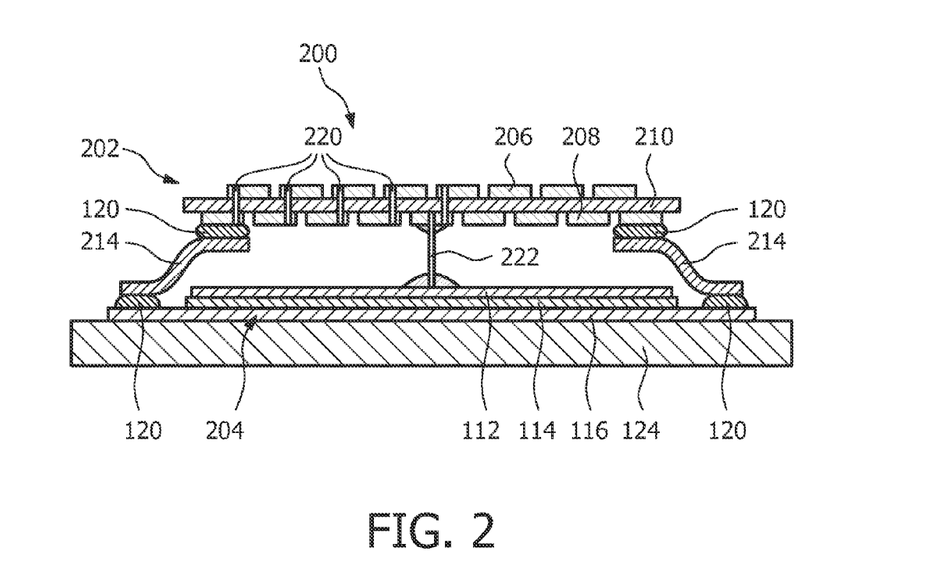
FIG. 2 is a schematic side view of an electroluminescent device with first and second receiver windings.

FIG. 2 is a schematic side view of an electroluminescent device 200. The electroluminescent device 200 comprises a sealing part 202 and an electroluminescent part 204. The sealing part 202 comprises first receiver windings 206 and second receiver windings 208. The sealing part 102 further comprises a substrate 210, conducting glue 120, and a metal plate 214. The electroluminescent part 204 comprises a first electrode layer 112, an electroluminescent layer 114, and a second electrode layer 116. The second electrode layer 116 is arranged on a glass plate 124.

The first metal plate 214 is connected to the second receiver winding 208 via conducting glue 120. At the other end of the first metal plate 214 the first metal plate 214 is connected to the second electrode layer 116 via conducting glue 120.

The first and the second receiver windings are connected to each other with gas-tight feedthroughs 220.

The first receiver windings 206 comprise gaps. The first receiver windings 206 are located at a first side of the substrate 210, while the second receiver windings 208 are located at a second side of substrate 210. The second receiver windings 208 comprise gaps. The second receiver windings 208 are located at the gaps of first receiver windings 206 and the first receiver windings 206 are located at the gaps of second receiver winding 208. Thus, the first and the second receiver windings 206 and 208 are arranged such that at least one side of the substrate is covered by one of the first and the second receiver windings 206 and 208. This is advantageous because the substrate may be permeable for gasses. The first and the second receiver windings 206 and 208 are preferably made of metal, which is not permeable for gasses. Thus, the first and the second receiver windings 206 and 208 are adapted for sealing the electroluminescent device 100.

Thus, the electroluminescent device 200 is sealed from the top by the first and the second receiver windings 206 and 208. At the bottom the electroluminescent device 200 is sealed by glass plate 124. At the sides the electroluminescent device 200 is sealed by the metal plate 214.

The metal plate 214 may for example be a round-shaped metal plate or for example a square-shaped metal plate shielding the electroluminescent device 200 to all four sides from gasses.

The second electrode layer 116 is connected to the second receiver windings 208 via conducting glue 120. In other words the second electrode layer 116 is connected via metal plate 214 to the second receiver windings 208.

The first and the second receiver windings 206 and 208 are connected to each other via a plurality of gas-tight feedthroughs 220. Thus, one could also name the first and the second receiver windings 206 and 208 as one single receiver winding being arranged partly above the substrate and partly below the substrate. The electromagnetic radiation may be received by the first and the second receiver windings 206 and 208, because the first and the second receiver windings 206 and 208 are electrically connected to each other via feedthroughs 220.

When electromagnetic radiation induces a voltage into the first and the second receiver windings 206 and 208 the first point, which is connected to the first electrode layer 112 via feedthrough 222 has a first electrical potential. The second point, which is connected to second electrode layer 116, has a second electrical potential. Between those two points there is applied a voltage due to a difference between the first and the second electrical potential. This voltage is also applied to the electroluminescent layer 114. Thus, the electroluminescent layer 114 emits light. The second electrode layer is transparent for the light emitted by the electroluminescent layer 114. The emitted light is emitted through the second electrode layer 116 and through the glass plate 124.

Figure 3:
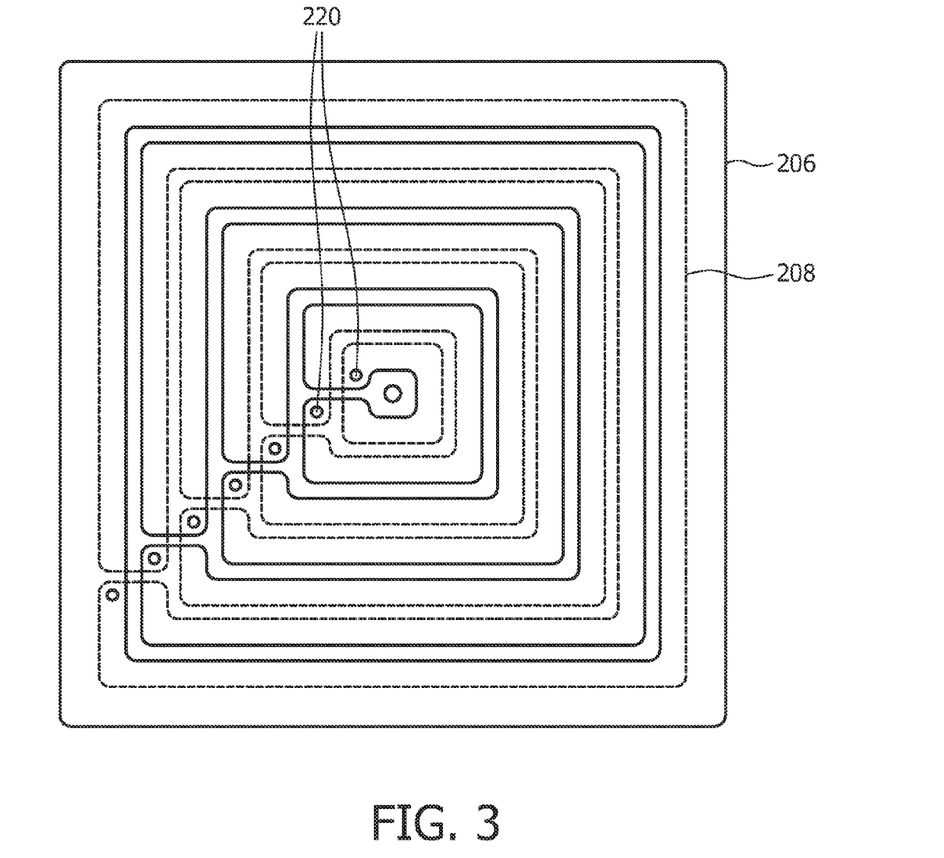
FIG. 3 is a schematic top view of the first and second receiver windings.

FIG. 3 is a schematic top view of first and second receiver windings 206 and 208. The first receiver windings 206 are located above the substrate (not visible). The second receiver windings 208 are located below the substrate. The first and the second receiver windings 206 and 208 are connected to each other with gas-tight feedthroughs 220. The first and the second receiver windings 206 and 208 comprise gaps. The first receiver windings 206 are depicted with solid lines, while the second receiver windings 208 are depicted with dashed lines. The second receiver windings 208 are arranged such that they cover the gaps of the first receiver windings 206. An electrical shortcut is avoided by the substrate being located in between the first and the second receiver windings 206 and 208. Near the gaps the first receiver windings 206 are electrically connected to the second receiver windings 208 via feedthroughs 220. Thus, the first and the second receiver windings 206 and 208 form a single receiver winding, which is arranged partly on a first side and partly on a second side of the substrate. The receiver winding seals the electroluminescent device (not depicted) gas-tight, because the second receiver windings 208 cover the gaps of the first receiver windings 206 and vice-versa.

Figure 4:
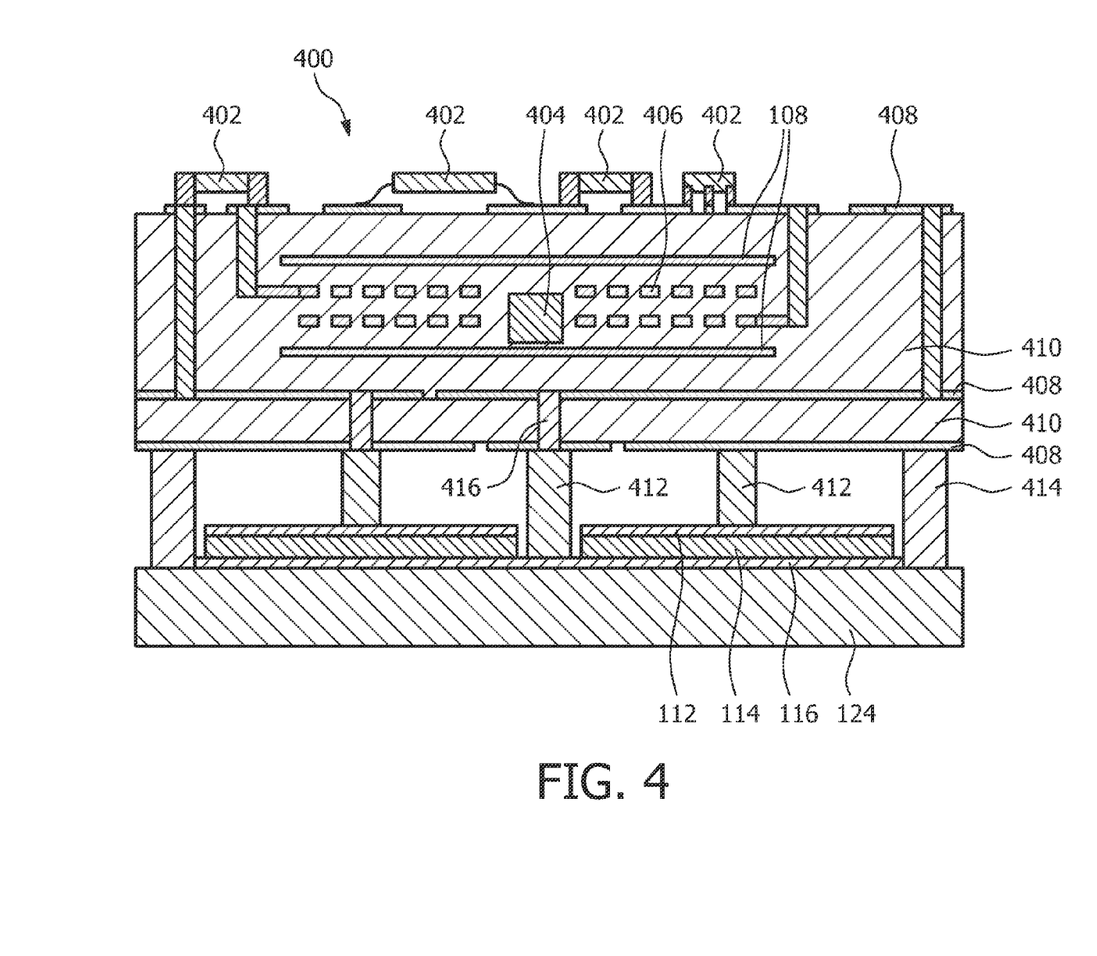
FIG. 4 is a schematic side view of an electroluminescent device with metal layers in the substrate.

FIG. 4 is a schematic side view of an electroluminescent device 400. The electroluminescent device 400 comprises electronic components 402, an inductor 404, a receiver winding 406, metal layers 408, a core 410, conducting posts 412, a first electrode layer 112, an electroluminescent layer 114, a second electrode layer 116, and a glass plate 124. The electroluminescent device 400 further comprises side sealings 414. The side sealings 414 are preferably made of a gas-tight material.

The receiver windings 406, the metal layer 408, and the metal connectors 416 are integrated into the core 410. The core 410 could also be referred to as a substrate. The whole core block 410 is used as the top sealing for the electroluminescent device 400. The side sealings 414 seal the sides of the electroluminescent device 400. By integrating the receiver windings 406, the metal layer 408, and the metal connectors 416 into the core 410 the whole top sealing may be produced as a printed circuit board. Also an inductor 404 may be comprised by core 410. Thus, the metal layers 408 seal the electroluminescent device 400. A voltage is applied to electroluminescent layer 114 by inducing a voltage into the receiver winding 406 with inductor 404.

The electronic components 402 may for example comprise rectifier diodes. The diodes may for example be arranged such that they are connected in series between the receiver winding and the first and the second electrode layers 112 and 116. The diodes may be mounted in the same forward direction as the electroluminescent layer 114.

In another embodiment, the electronic components comprise a full-bridge rectifier. It may be advantageous to add additional resonant capacitors connected in series or in parallel.

The electronic components 402 may be added to the printed circuit board (PCB) of the receiver winding, e.g. as Surface Mount Devices (SMD) or as bare chips bonded to the PCB.

Figure 5:
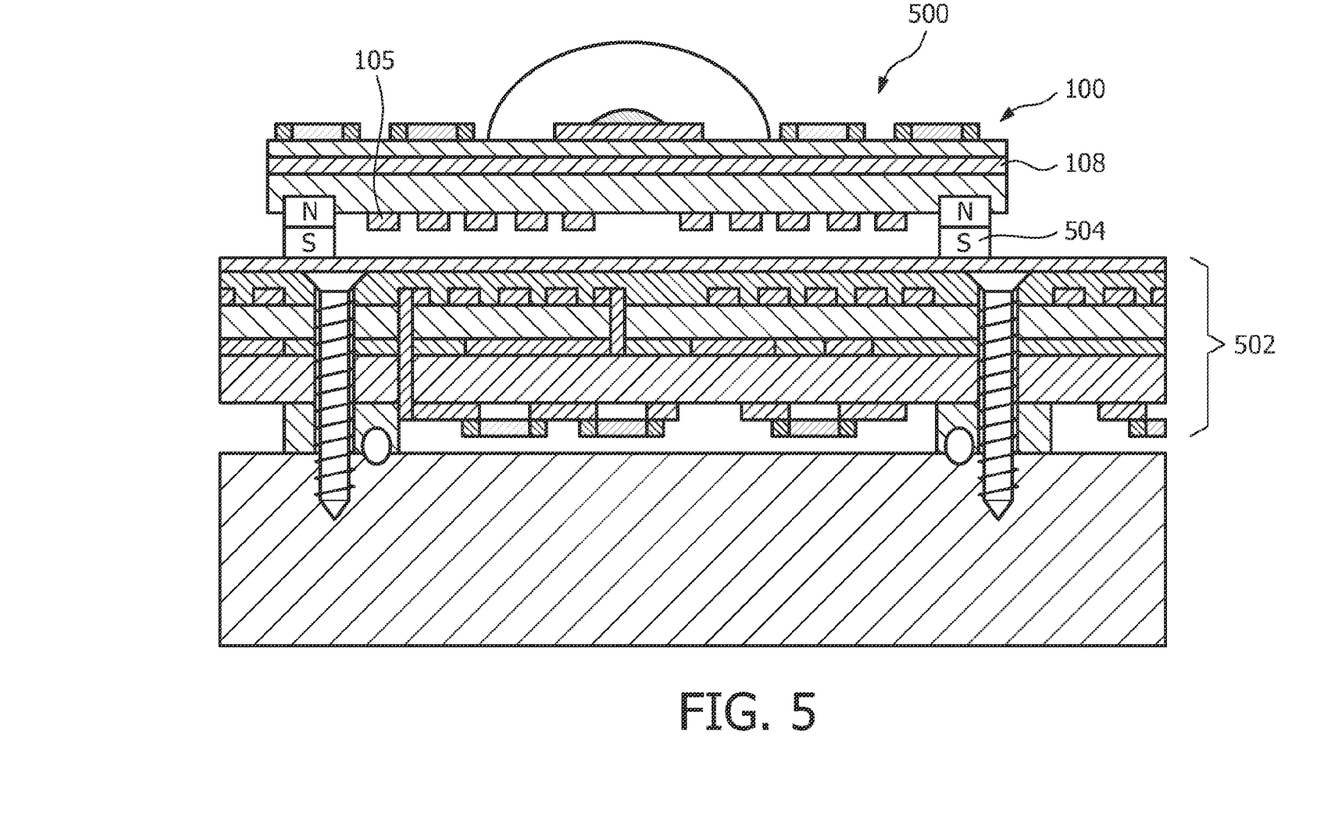
FIG. 5 is a schematic side view of an illuminating system comprising an electroluminescent device according to embodiments of the invention and an inductor.

FIG. 5 is a schematic side view of an illuminating system according to embodiments of the invention. The illuminating system 500 comprises an electroluminescent device 100, an inductor 502, and two magnets 504. The inductor 502 is fixed to a wall or ceiling 506 with fixation means 508. Fixation means 508 may for example be screws, bolts, or nails. By connecting the inductor 502 with magnets 504 to electroluminescent device 100 the induced magnetic field into receiver winding 105 is enforced. The electroluminescent device 100 comprises as soft magnetic shielding 108 for shielding the sealing (not depicted) from the electromagnetic radiation emitted by the inductor 502.

Figure 6:
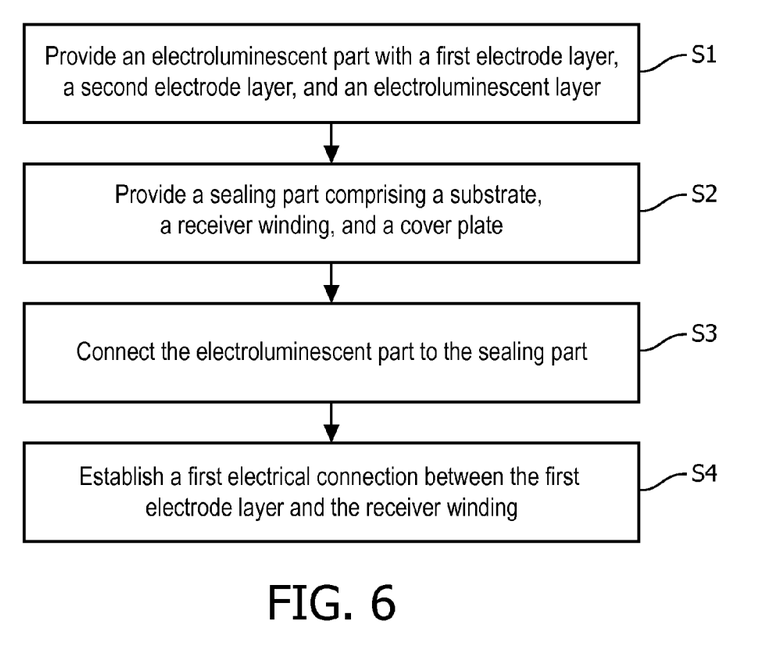
FIG. 6 is a flow diagram of a method of producing a gas-tight electroluminescent device according to embodiments of the invention.

FIG. 6 is a flow diagram of a method of producing a gas-tight electroluminescent device. In step S1 an electroluminescent part with a first electrode layer, a second electrode layer, and an electroluminescent layer is provided. The electroluminescent layer is located between the first and the second electrode layers.

Step S2 comprises providing a sealing part. The sealing part comprises a substrate, at least one receiver winding, and a cover plate. The at least one receiver winding is arranged on the substrate and the cover plate is mechanically connected to the substrate. In step S3 the electroluminescent part is connected to the sealing part. The connection is established via the cover plate. The electroluminescent and the sealing part form the gas-tight electroluminescent device.

Step S4 comprises establishing a first electrical connection between the first electrode layer and the at least one receiver winding. Further, a second electrical connection is established between the second electrode layer and the at least one receiver winding.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

| LIST OF REFERENCE NUMERALS: | |
|---|---|
| 100 | Electroluminescent device |
| 102 | Sealing part |
| 104 | Electroluminescent part |
| 105 | Receiver winding |
| 106 | Substrate |
| 108 | Soft magnetic shielding |
| 110 | Metal plate |
| 112 | First electrode layer |
| 114 | Electroluminescent layer |
| 116 | Second electrode layer |
| 118 | Feedthrough |
| 120 | Conducting glue |
| 122 | Feedthrough |
| 124 | Glass plate |
| 200 | Electroluminescent device |
| 202 | Sealing part |
| 204 | Electroluminescent part |
| 206 | First receiver windings |
| 208 | Second receiver windings |
| 210 | Substrate |
| 214 | Metal plate |
| 220 | Feedthroughs |
| 222 | Feedthrough |
| 400 | Electroluminescent device |
| 402 | Electrical components |
| 404 | Inductor |
| 406 | Receiver winding |
| 408 | Metal layer |
| 410 | Core |
| 412 | Conducting posts |
| 414 | Side sealings |
| 416 | Metal connectors |
| 500 | Illuminating system |
| 502 | Inductor |
| 504 | Magnet |

-continued

LIST OF REFERENCE NUMERALS:

| | |
|---|---|
| 506 | Wall/ceiling |
| 508 | Fixation means |

The invention claimed is:

1. A gas-tight electroluminescent device comprising an electroluminescent part and a sealing part, the electroluminescent part comprising an electroluminescent layer, a first electrode layer, and a second electrode layer, the sealing part comprising a substrate, a cover plate for gas-tight sealing the electroluminescent device, and at least one receiver winding for receiving electromagnetic radiation, wherein
   the electroluminescent layer is located between the first and the second electrode layer;
   the sealing part is connected gas-tight to the electroluminescent part via the cover plate,
   the first electrode layer is electrically connected to a first point of the receiver winding;
   the second electrode layer is electrically connected to a second point of the receiver winding;
   the at least one receiver winding is arranged on the substrate, and wherein the at least one receiver winding comprises first and second receiver windings wherein the first receiver windings are arranged above the substrate, wherein the first receiver windings are separated by gaps, wherein the second receiver windings are arranged below the substrate under the gaps such that the first and the second receiver windings are adapted for sealing the electroluminescent device and wherein the first and the second receiver windings are electrically connected to each other with a plurality of feed-throughs.

2. The gas-tight electroluminescent device according to claim 1, wherein the electrical connection of the first electrode layer to the first point of the receiver winding leads through a feed-through, the feed-through leading through the substrate.

3. The gas-tight electroluminescent device according to claim 1, wherein the cover plate is a glass plate.

4. The gas-tight electroluminescent device according to claim 1, wherein the cover plate is a electrically conductive, and wherein the electroluminescent device further comprises a soft-magnetic shielding for avoiding induction of an electric current into the electrically conductive plate by electromagnetic radiation.

5. The gas-tight electroluminescent device according to claim 4, wherein the first or the second electrode layer is electrically connected to the receiver winding via the cover plate.

6. The gas-tight electroluminescent device according to claim 4, wherein the receiver winding has a winding origin and a peripheral winding end, wherein the first point of the receiver winding is located at the winding origin, and wherein the second point of the receiver winding is located at the peripheral winding end.

7. The gas-tight electroluminescent device according to claim 4, wherein the substrate is made of polymers.

8. The gas-tight electroluminescent device according to claim 6, wherein the substrate comprises at least one metal layer for avoiding gas diffusion through the substrate.

9. The gas-tight electroluminescent device according to claim 6, wherein the electroluminescent device comprises a glass mounting structure, wherein the second electrode layer is located on the glass mounting structure, and wherein the second electrode layer is transparent.

10. An illuminating apparatus comprising a plurality of electroluminescent devices of claim 8.

11. An illuminating system comprising an electroluminescent device according to claim 8 and an inductor, wherein the inductor is adapted for establishing an electromagnetic field in the region of the electroluminescent device, wherein the electromagnetic filed induces a current in the electroluminescent device.

* * * * *